(12) United States Patent
Avouris et al.

(10) Patent No.: US 8,614,435 B2
(45) Date of Patent: Dec. 24, 2013

(54) UTILIZATION OF ORGANIC BUFFER LAYER TO FABRICATE HIGH PERFORMANCE CARBON NANOELECTRONIC DEVICES

(75) Inventors: Phaedon Avouris, Yorktown Heights, NY (US); Damon B. Farmer, Yorktown Heights, NY (US); Fengnian Xia, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 832 days.

(21) Appl. No.: 12/611,421

(22) Filed: Nov. 3, 2009

(65) Prior Publication Data

US 2011/0101308 A1    May 5, 2011

(51) Int. Cl.
*H01L 29/786* (2006.01)
*H01L 21/336* (2006.01)

(52) U.S. Cl.
USPC .............. 257/27; 257/E21.411; 257/E29.273; 977/734; 977/738

(58) Field of Classification Search
USPC ............... 257/27, E29.273; 977/734, 738
See application file for complete search history.

(56) References Cited

U.S. PATENT DOCUMENTS

| | | | |
|---|---|---|---|
| 7,351,604 B2 | 4/2008 | Cross et al. | |
| 7,387,974 B2 | 6/2008 | Holmes et al. | |
| 7,491,631 B2 | 2/2009 | Furukawa et al. | |
| 7,560,366 B1 | 7/2009 | Romano et al. | |
| 2005/0263388 A1 | 12/2005 | Lee et al. | |
| 2006/0211236 A1 | 9/2006 | Bureau et al. | |
| 2007/0164430 A1 | 7/2007 | Lin et al. | |
| 2007/0287011 A1* | 12/2007 | DeHeer | 428/411.1 |
| 2008/0041300 A1 | 2/2008 | Cho et al. | |
| 2008/0296537 A1 | 12/2008 | Gordon et al. | |
| 2008/0296562 A1* | 12/2008 | Murduck et al. | 257/40 |

OTHER PUBLICATIONS

Yuerui Lu et al., "DNA Functionalization of Carbon Nanotubes for Ultrathin Atomic Layer Deposition of High k Dielectrics for Nanotube Transistors with 60 mV/Decade Switching," J. Am. Chem. Soc. 2006, 128, 3518-3519.
Damon B. Farmer et al., "Atomic Layer Deposition on Suspended Single-Walled Carbon Nanotubes via Gas-Phase Noncovalent Functionalization," American Chemical Society, Nano Letters 2006, vol. 6, No. 4, 699-703.
Max C. Lemme et al., "A Graphene Field-Effect Device," IEEE Electron Device Letters, vol. 28, No. 4, Apr. 2007.
J. R. Williams et al., "Quantum Hall Effect in a Gate-Controlled p-n Junction of Graphene," Science 317, 638 (2007).
Inanc Meric et al., "Current Saturation in Zero-Bandgap, Top-Grated Graphene Field-Effect Transistors," Nature Nanotechnology, vol. 3, Nov. 2008, Macmillan Publishers Limited.

(Continued)

*Primary Examiner* — Lynne Gurley
*Assistant Examiner* — Vernon P Webb
(74) *Attorney, Agent, or Firm* — Cantor Colburn LLP; Vazken Alexanian

(57) ABSTRACT

A fabrication process for a nanoelectronic device and a device are provided. Channel material is deposited on a substrate to form a channel. A source metal contact and a drain metal contact are deposited on the channel material, and the source metal contact and the drain metal contact are on opposing ends of the channel material. A polyhydroxystyrene derivative is deposited on the channel material. A top gate oxide is deposited on the polymer layer. A top gate metal is deposited on the top gate oxide.

8 Claims, 9 Drawing Sheets

(56) References Cited

OTHER PUBLICATIONS

Yu-Ming Lin et al., "Operation of Graphene Transistors at Gigahertz Frequencies," American Chemical Society, Nano Letters, 2009, vol. 9, No. 1, 422-426.

Atindra Nath Pal et al., "Resistance Noise in Electrically Biased Bilayer Graphene," 2009 The American Physical Society, PRL 102, 126805 (2009).

Xinran Wang et al., "Atomic Layer Deposition of Metal Oxides on Pristine and Functionalized Graphene," J. Am. Chem. Soc. 2008, vol. 130, No. 26, 8152-8153.

Seyoung Kim et al., "Realization of a High Mobility Dual-grated Graphene Field Effect Transistor with Al2O3 Dielectric," http://arxiv.org/abs/0901/2901.

\* cited by examiner

UTILIZATION OF ORGANIC BUFFER LAYER TO FABRICATE HIGH PERFORMANCE CARBON NANOELECTRONIC DEVICES

This invention was made with U.S. Government support under Government Contract No. FA8650-08-C-7838 awarded by the Defense Advanced Research Projects Agency (DARPA). The Government has certain rights in the invention.

BACKGROUND

The present invention relates to nanoelectronic devices, and more specifically, to utilization of an organic buffer layer in nanoelectronic devices.

Graphene has recently emerged as an interesting material for electronics due to extremely high carrier mobility in bulk grapheme and the demonstration of all-semiconducting sub-10 nm (nanometer) grapheme nanoribbons. Aggressive device scaling requires integration of ultrathin high-k dielectrics in order to achieve high on-state current and ideal subthreshold swing without substantial gate leakage. Working with graphene, however, presents unique issues for nanodevices.

BRIEF SUMMARY

According to one exemplary embodiment, a fabrication process for a nanoelectronic device is provided. Channel material is deposited on a substrate to form a channel. A source metal contact and a drain metal contact are deposited on the channel material, and the source metal contact and the drain metal contact are on opposing ends of the channel material. A polymer layer which is a derivative of polyhydroxystyrene is deposited on the channel material. A top gate oxide is deposited on this polymer layer. A top gate metal is deposited on the top gate oxide.

According to one exemplary embodiment, a fabrication process for a nanoelectronic device is provided. A first polymer layer which is a derivative of polyhydroxystyrene is deposited on a substrate. Channel material is deposited on the first polymer layer to form a channel. A source metal contact and a drain metal contact are deposited on the channel material, and the source metal contact and the drain metal contact are on opposing ends of the channel material. A second polymer layer which is a derivative of polyhydroxystyrene is deposited on the channel material, and the first polymer layer and second polymer layer sandwich the channel material. A top gate oxide is deposited on the second polymer layer. A top gate metal is deposited on the top gate oxide.

Other systems, methods, apparatus, and/or computer program products according to embodiments will be or become apparent to one with skill in the art upon review of the following drawings and detailed description. It is intended that all such additional systems, methods, apparatus, and/or computer program products be included within this description, be within the scope of the exemplary embodiments, and be protected by the accompanying claims. For a better understanding of the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features are apparent from the following detailed description taken in conjunction with the accompanying drawings in which:

DETAILED DESCRIPTION

Exemplary embodiments utilize an organic polymer, which is NFC-1400, as a seed layer for graphene. The difficulties of depositing material on graphene is known because of graphene's lack of dangling bonds and reactive sites, which usually results in bare, uncoated regions on the graphene surface when using direct deposit. Exemplary embodiments, however, utilize NFC-1400 on the graphene layer without the common nonuniformity.

The polymer NFC-1400 is manufactured by and is commercially available from JSR Micro Corporation, 1280 North Mathilda Avenue, Sunnyvale, Calif. 94089. Conventionally, NFC-1400 is marketed and used as an antireflective, planarization coating.

FIGS. 1-9 illustrate a device fabrication process utilizing NFC-1400 as a seed layer on graphene in accordance with exemplary embodiments. Although the device fabrication process is illustrated for field effect transistors (FETs), it is understood that other nanodevices may be fabricated according to exemplary embodiments.

Figure 1:
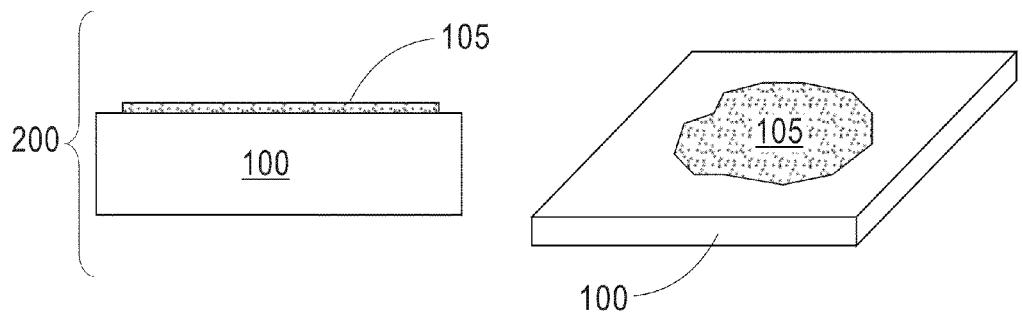
FIGS. 1-9 illustrate a device fabrication process in accordance with exemplary embodiments.

Now turning to FIG. 1, FIG. 1 illustrates a process 200 for building a nanodevice, which is a FET device. The process 200 illustrates two views of the nanodevice. A cross-sectional view is shown on the left and a plan view is shown on the right for building the nanodevice as shown in FIGS. 1-9.

FIG. 1 illustrates a substrate 100. The substrate may be any type of insulator such as silicon carbide, silicon dioxide, aluminum oxide, etc. Graphene 105 is deposited on the insulating substrate 100 by, e.g., mechanical exfoliation or growing the graphene 105 epitaxially on the insulating substrate 100.

Figure 2:
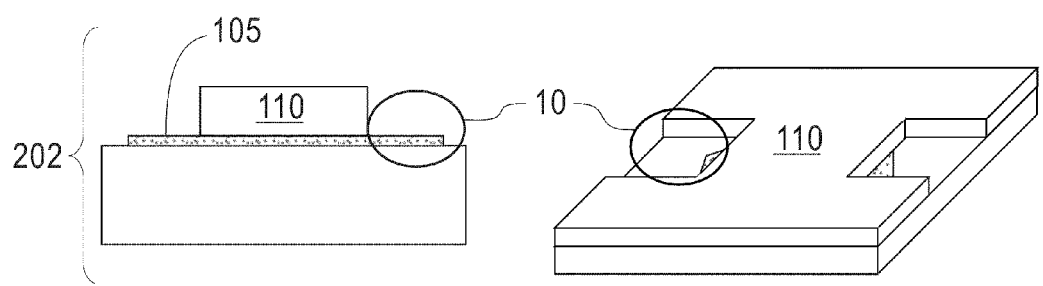
Figure 2:
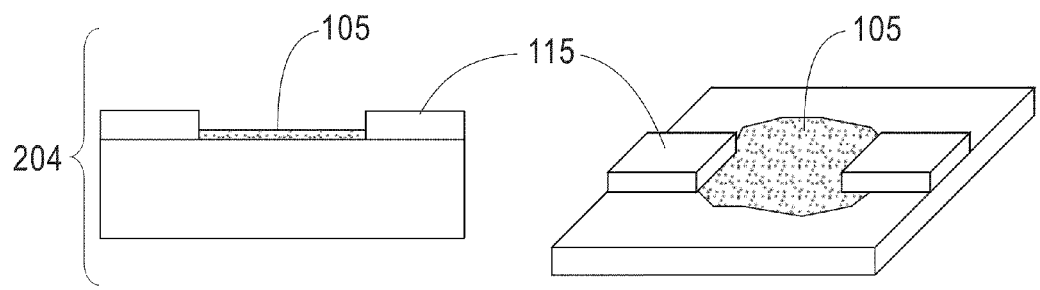

FIG. 2 illustrates a process 202 to continue building the nanodevice. In the process 202, a resist mask 110 is patterned on the graphene 105 and the substrate 100 to define the electrode regions 10. The electrode regions 10 are shown as ovals in FIG. 2. The resist mask 110 is utilized to deposit electrodes for the source and drain in the electrode regions 10.

Utilizing the resist mask 110, the source and drain electrodes 115 are deposited on opposite ends of the graphene 105 and the substrate 100 as shown in the process 204. The source and drain electrodes 115 are formed as metal contacts on the graphene 105 and substrate 100.

Figure 3:
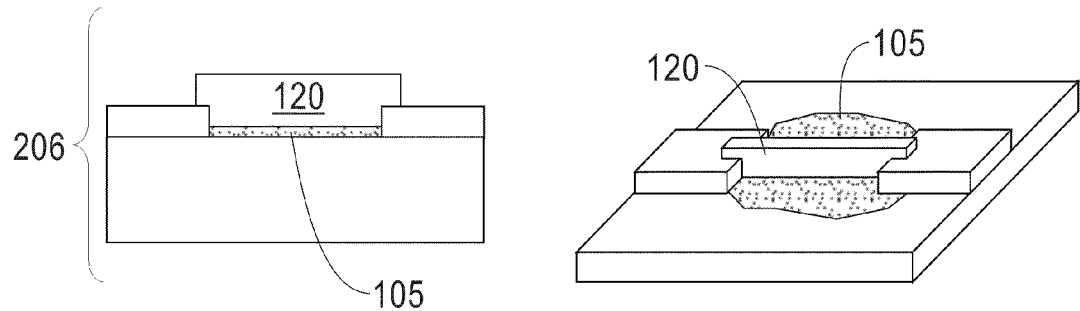

Now that the source and drain electrodes 115 have been deposited, FIG. 3 illustrates a process 206 to continue building the nanodevice. In the process 206, a protective mask 120 is patterned to define the shape of a channel region of the device. The mask 120 provides a width to the graphene 105 and protects the graphene 105 underneath the mask when the exposed graphene 105 is etched away.

Figure 4:
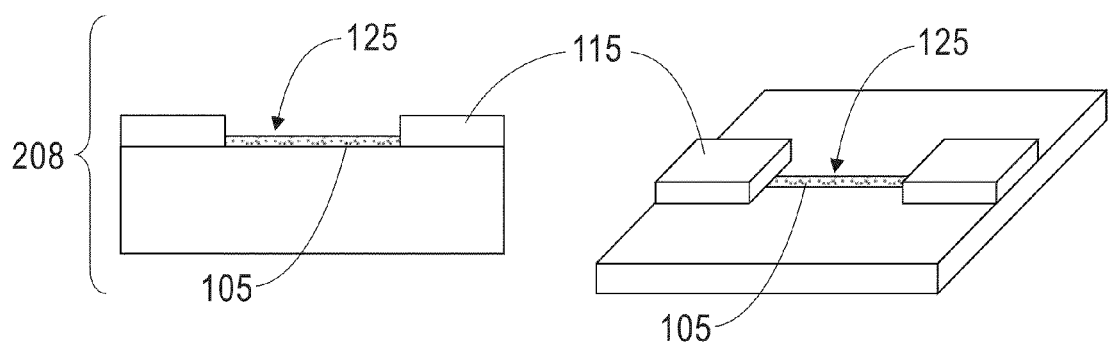

FIG. 4 illustrates a process 208 to continue building the nanodevice. In the process 208, the unprotected graphene 105 is etched away to define the graphene channel 125. As seen in FIG. 4, the electrodes 115 are located on opposite sides of the graphene channel 105.

Figure 5:
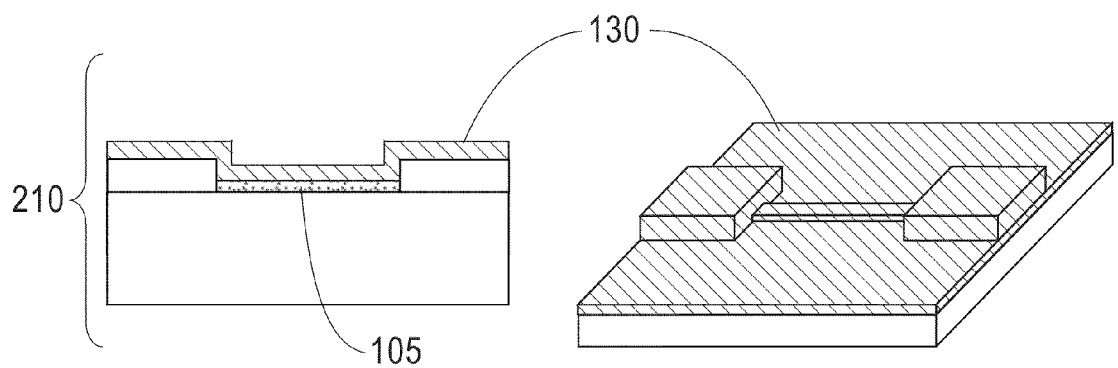

In process 210 of FIG. 5, a film of polymer 130 (which is NFC-1400 in this example) is spun onto the (entire) surface of the nanodevice. Further regarding NFC-1400, NFC-1400 is a spin-on polymer composed of polyhydroxystyrene with and without functional dyes. This NFC-1400 polymer 130 may be diluted in propylene glycol monomethyl ether acetate (PG-MEA) and spun on the graphene surface. At an appropriate dilution, spin speed, and spin duration, a continuous 10 nm thick layer of NFC can be achieved.

Although NFC-1400 is the polymer 130 shown in exemplary embodiments, other polymers that exhibit characteristics as NFC-1400 may be utilized. For example, characteristics of a good polymer 130 seed layer (NFC-1400) require that:

(1) Its thickness can be scaled through chemical dilution.
(2) It uniformly coats the graphene surface.
(3) It does not damage the graphene surface.
(4) Its processing can be implemented at low temperatures, e.g., 25° C.-200° C.
(5) It does not chemically react with the graphene surface.
(6) It chemically reacts with ALD and/or CVD precursors.
(7) It is chemically compatible with other fabrication processes normally employed.
(8) It does not dramatically degrade carrier mobility in graphene by more than, e.g., 20%.

In accordance with exemplary embodiments, NFC-1400 has the characteristics that satisfy all of these requirements. However, other polymers that were tested do not. For example polyhydroxystyrene (PHS) does not satisfy requirement 2, poly(methylmethacrylate) (PMMA) does not satisfy requirement 1 or 2, and polyethylene imine (PEI) does not satisfy requirement 2. Also, if an insulator were deposited directly on the graphene 105, the insulator would not cover the graphene 105 and would not maintain the electrical properties of the graphene 105, because the graphene 105 is very inert. Conventional deposition methods do not uniformly cover the graphene 105 surface.

As such, exemplary embodiments can utilize polymer 130 (NFC-1400) as seed layer to uniformly cover the graphene 105 surface.

Figure 6:
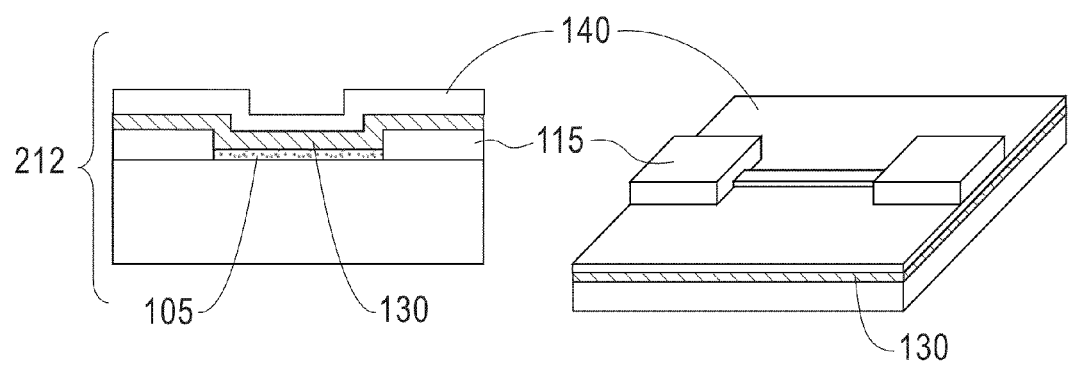

FIG. 6 illustrates a process 212 to continue building the nanodevice. In the process 212, atomic layer deposition (ALD) may be utilized to deposit an oxide 140 over the entire surface of the device. In other words, the oxide 140 is deposited on the NFC-1400 polymer 130. The oxide 140 may be suitable insulating material such as, e.g., silicon dioxide ($SiO_2$).

Figure 7:
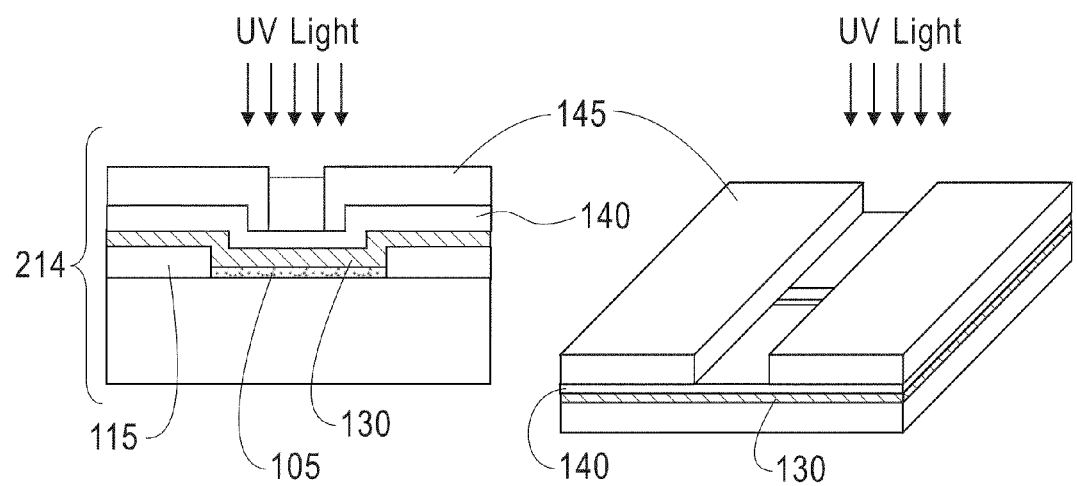

FIG. 7 illustrates a process 214 that continues building the nanodevice. In the process 214, a top gate pattern of PMMA 145 is developed and exposed to either ultraviolet (UV) light or electron beam irradiation. The PMMA 145 is a mask that is deposited on top of the oxide layer 140 so that a top gate electrode can be patterned.

Figure 8:
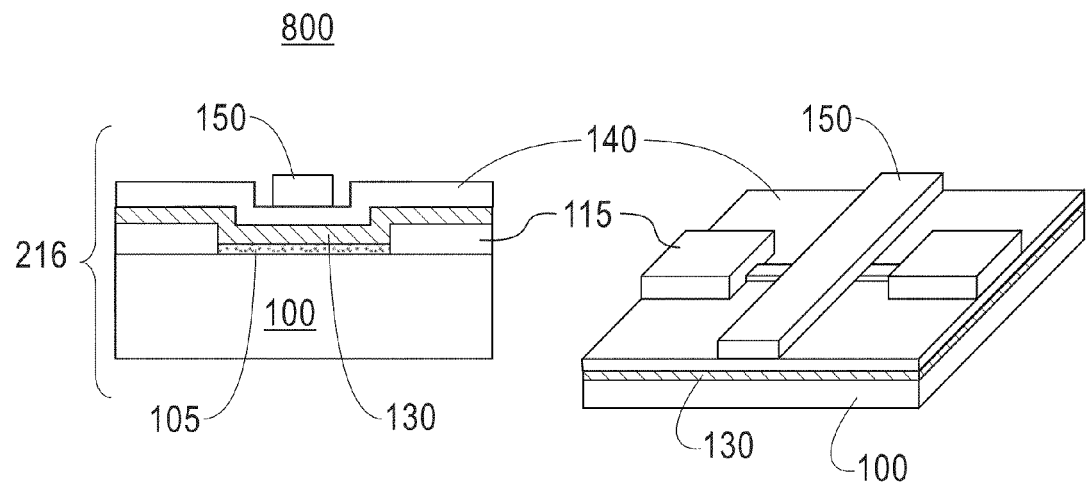

The top gate electrode 150 is shown in a process 216 to continue building the nanodevice in FIG. 8. In the process 216, the top gate electrode 150 is applied on the oxide 140 layer where the PMMA 145 was not applied. During the process 216, there is metallization of the top gate electrode 150 and isopropanol (IPA) may be applied to lift off the PMMA 145 after UV exposure of the PMMA. Acetone may also be used to lift off the PMMA 145 without UV exposure. The finished nanodevice 800 is a top gated graphene transistor.

As seen in FIG. 8, the nanodevice 800 includes the substrate 100. The graphene 105 is on top of the substrate 100 with electrodes 115 on both ends of the graphene 105 to form an electrical connection. The NFC 1400 polymer 130 is on top of the graphene 105, electrodes 115, and the substrate 100. The oxide 140 layer is on top of the NFC 1400 polymer 130. The top gate electrode 150 is on top of the oxide 140.

Figure 9:
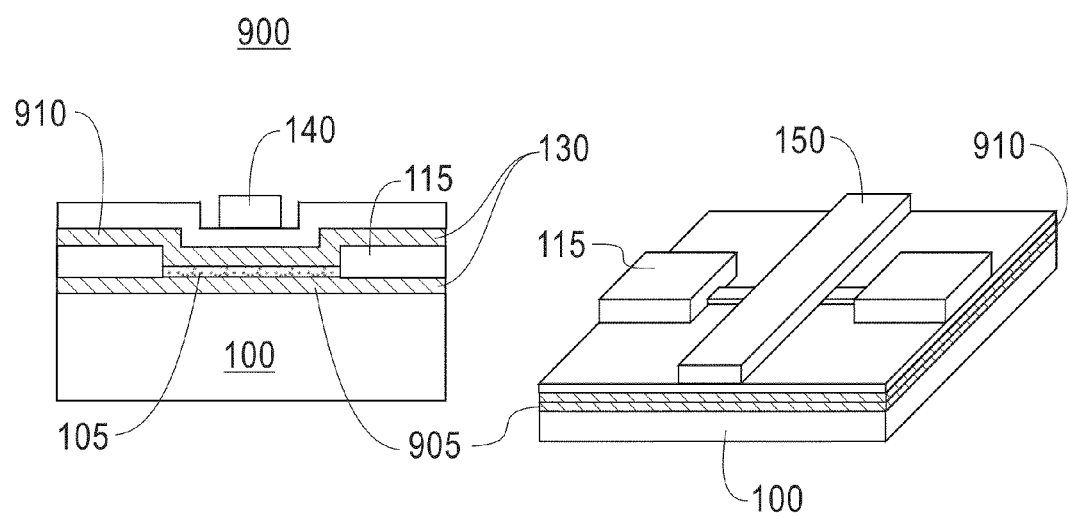

FIG. 9 illustrates another example of utilizing the graphene 105 in accordance with exemplary embodiments. FIG. 9 illustrates a nanodevice 900 that has been fabricated with the graphene 105 interposed between two layers of NFC-1400 according to exemplary embodiments.

The fabrication of the nanodevice 900 is similar to the nanodevice 800 (and the processes shown in FIGS. 1-8) as one skilled in the art would understand, except that a bottom layer 905 of the NFC-1400 polymer 130 is deposited on the substrate 100 before the graphene 105 is applied. That is, the NFC-1400 polymer 130 is deposited on the substrate 100 as a bottom layer 905 just as the polymer 130 is applied in FIG. 5 to make nanodevice 800. Subsequently, the graphene 105 is deposited on the bottom layer 905 of the polymer 130 which is similar to FIG. 1 except the substrate 100 is now coated with the polymer 130 of the bottom layer 905 prior to depositing the graphene 105.

After the graphene 105 is deposited on the bottom layer 905 of the polymer 130, referring to FIG. 2 as a reference, the fabrication process continues to form the electrodes 115 by patterning the mask 110 to leave the electrode regions 10 exposed so that the electrodes 115 are deposited on the bottom layer 905 of the polymer 130.

As in FIG. 3, the mask 120 is applied so that the graphene channel 125 can be formed as shown in FIG. 4. The top layer 910 of the polymer 130 is deposited (similar to FIG. 5) on the graphene channel 125, the electrodes 115, and the bottom layer 905.

For the nanodevice 900, the oxide 140 is deposited on the graphene channel 125, the electrodes 115, and the bottom layer 905 similar to FIG. 6. The remaining operations in the process are identical to FIGS. 7 and 8, which result in the nanodevice 900.

It is understood that the materials in FIGS. 1-9 may be deposited using any suitable method as known in the art, such as evaporation, sputter deposition, chemical vapor deposition (CVD), plasma enhanced chemical vapor deposition (PECVD), epitaxy, atomic layer deposition (ALD), electroplating, etc.

Figure 10:
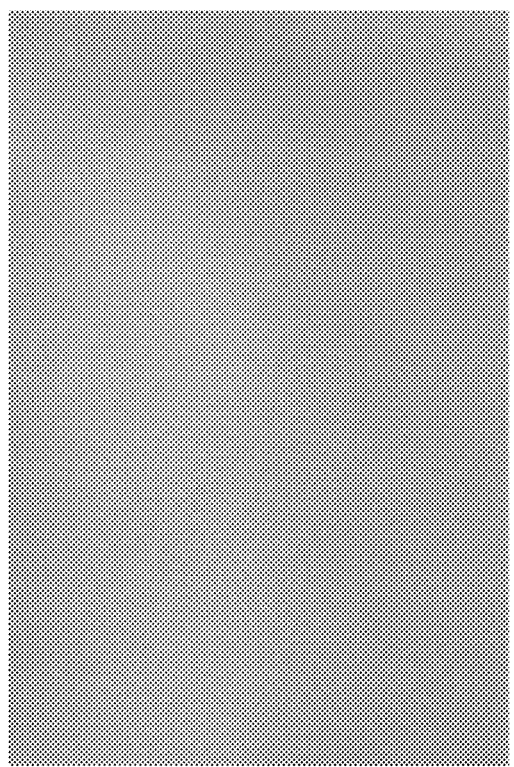
FIG. 10 illustrates an example of atomic layer deposition (ALD) nucleation behavior in accordance with exemplary embodiments.
Figure 10:
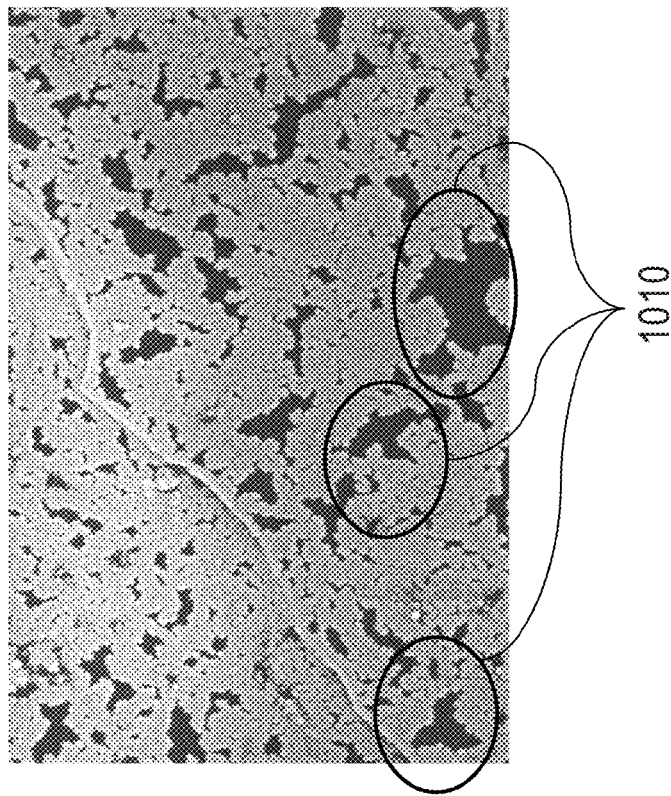

FIG. 10 illustrates an example of atomic layer deposition (ALD) nucleation behavior in accordance with exemplary embodiments. A diagram 1005 illustrates an example of how hafnium dioxide ($HfO_2$) is deposited on graphene without NFC-1400 as a seed layer. There are many darks spots in the diagram 1005 which indicates that the hafnium dioxide (by itself) is not uniformly distributed on the graphene surface. The ovals 1110 highlight examples of a few of the bare spots indicating the nonuniformity of the hafnium dioxide layer.

However, diagram 1015 illustrates an example in which NFC-1400 is first deposited on the graphene before applying the hafnium dioxide. As seen in the diagram 1015, there is uniform distribution of the hafnium dioxide on the graphene when NFC-1400 is an intermediary between the hafnium dioxide and the graphene. Particularly, the —OH and —$CH_3$ groups in the NFC-1400 provide nucleation sites for uniform and continuous ALD.

In diagram 1100, 10 nanometers (nm) of hafnium dioxide (HfO$_2$) is deposited on silicon, and in diagram 1115, 10 nanometers (nm) of hafnium dioxide (HfO$_2$) is deposited on the NFC-1400 which is deposited on silicon.

Figure 11:
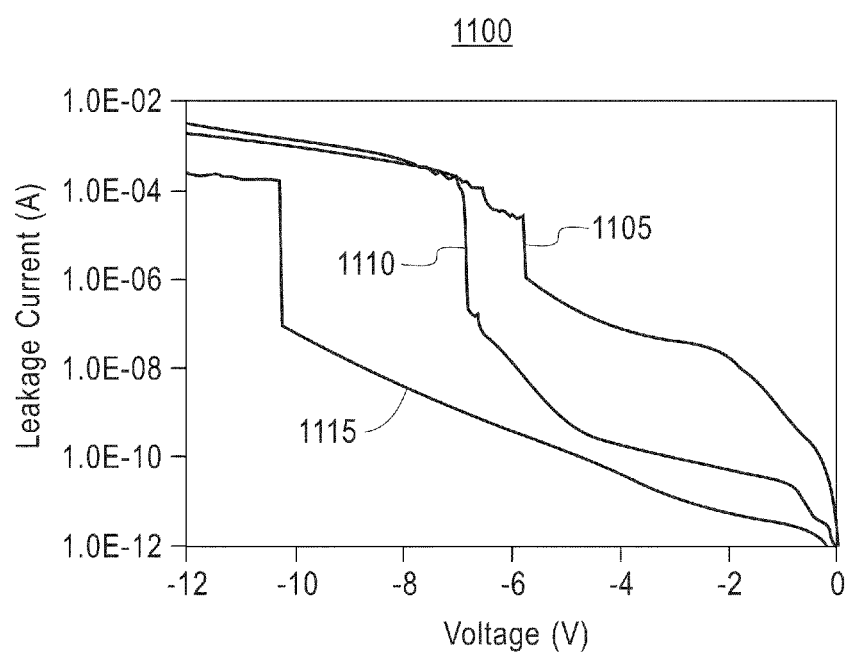
FIG. 11 illustrates a graph in accordance with exemplary embodiments.

FIG. 11 illustrates a graph 1100 in accordance with exemplary embodiments. The graph 1100 depicts dielectric leakage characteristics. The line 1105 represents the dielectric leakage characteristics of 10 nm of NFC-1400. The line 1110 illustrates the dielectric leakage characteristics of 10 nm of hafnium dioxide (HfO$_2$). The line 1115 illustrates the dielectric leakage characteristics of 10 nm NFC-1400 combined with 10 nm HfO$_2$.

As seen from the graph 1100, while NFC-1400 is a poor insulator, HfO$_2$ is a robust insulator. However, the combination of NFC-1400 and HfO$_2$ is a dielectric stack that can be stressed to −5 volts (V) before reaching 1 nanoampere (nA) of leakage current. Accordingly, the combination of NFC-1400 and HfO$_2$ exhibits good characteristics that are very similar to HfO$_2$ alone while simultaneously the NFC-1400 (as an intermediary) allows the uniform distribution of HfO$_2$ on the graphene surface (as shown in FIG. 10). As such, NFC-1400 can be seen as not degrading the electrical properties of HfO$_2$ in accordance with exemplary embodiments.

Figure 12:
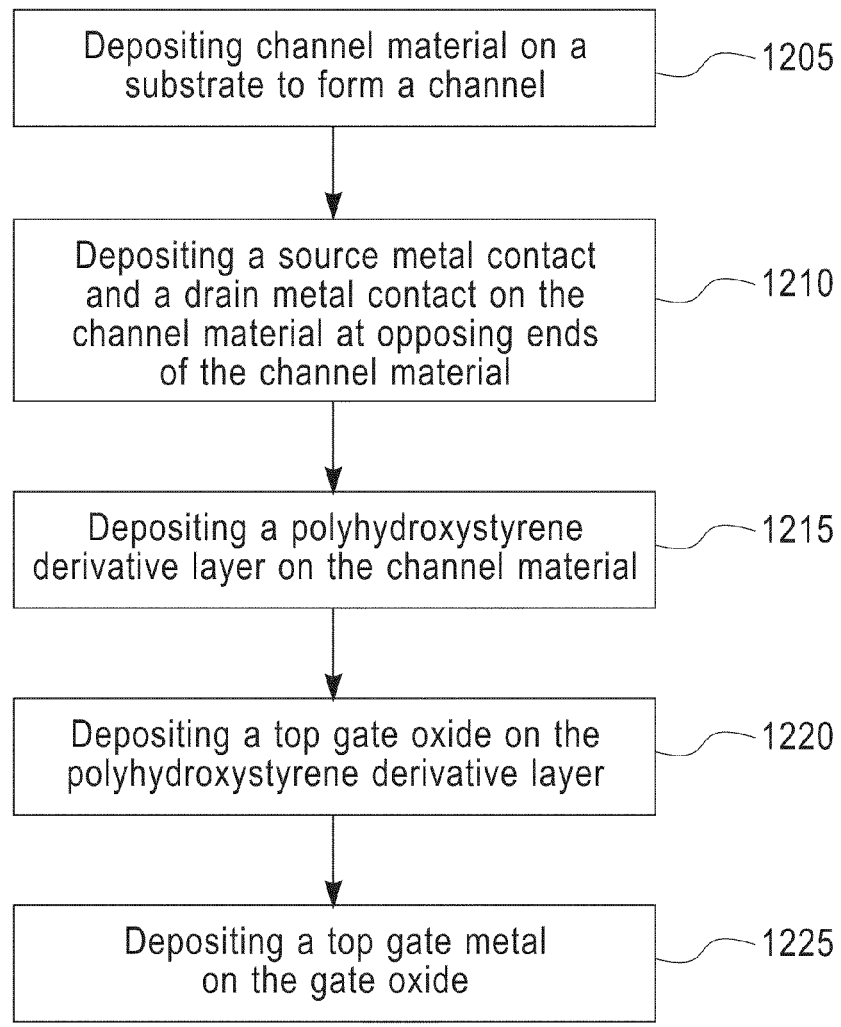
FIG. 12 illustrates a fabrication process for a nanoelectronic device in accordance with exemplary embodiments.

FIG. 12 illustrates a fabrication process for a nanoelectronic device in accordance with exemplary embodiments. Channel material (such as the graphene 105) is deposited on a substrate (such as the substrate 100) to form a channel (such as the channel 125) at 1205.

A source metal contact and a drain metal contact (such as the electrodes 115) are deposited on the channel material, and the source metal contact and the drain metal contact are on opposing ends of the channel material (such as the channel 125) at 1210.

A polyhydroxystyrene derivative (such as the polymer 130 is deposited on the channel material at 1215.

A top gate oxide (such as the oxide layer 140) is deposited on the polyhydroxystyrene derivative at 1220.

A top gate metal (such as the top gate electrode 150) is deposited on the top gate oxide at 1225.

Figure 13:
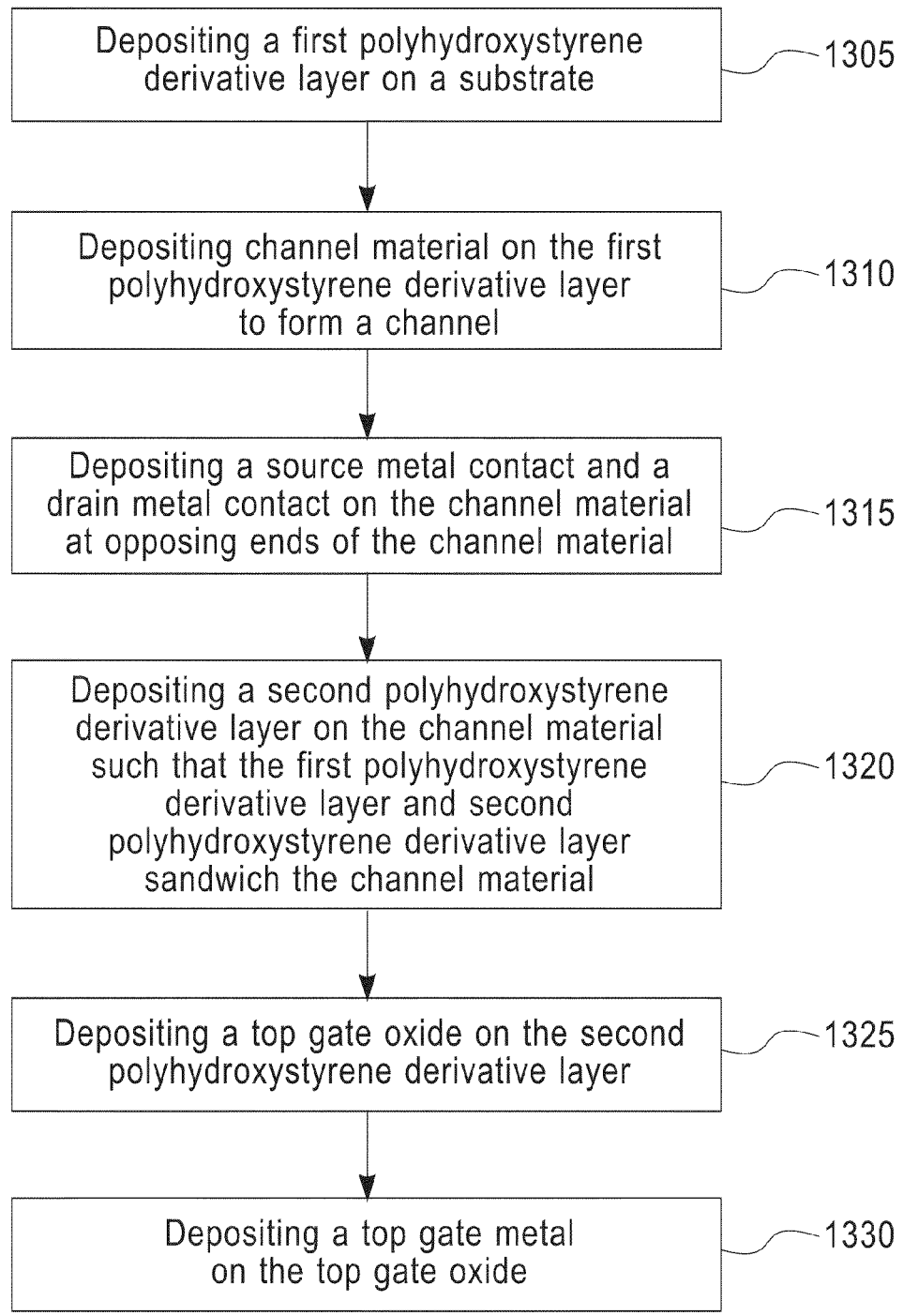
FIG. 13 illustrates a fabrication process for a nanoelectronic device in accordance with exemplary embodiments.

FIG. 13 illustrates a fabrication process for a nanoelectronic device in accordance with exemplary embodiments.

A first polymer of polyhydroxystyrene derivative (such as the bottom layer 905 of the polymer 300) is deposited on a substrate (such as the substrate 100) at 1305.

A channel material (such as the graphene 105) is deposited on the first polyhydroxystyrene derivative to form a channel (such as the channel 125) at 1310.

A source metal contact and a drain metal contact (such as the electrodes 115) are deposited on the channel material, and the source metal contact and the drain metal contact are on opposing ends of the channel material at 1315.

A second polymer of polyhydroxystyrene derivative (such as the top layer 910 of the polymer 300) is deposited on the channel material, and the first polymer layer and second polymer layer sandwich the channel material (as shown between top and bottom layers 905 and 910 in FIG. 9) at 1320.

A top gate oxide (such as the oxide 140) is deposited on the second polymer layer of polyhydroxystyrene derivative at 1325.

A top gate metal (such as the top gate metal 150) is deposited on the top gate oxide at 1330.

As discussed herein, spun-on NFC-1400 can be used as a seed layer for uniform ALD of high-k dielectrics on graphene in accordance with exemplary embodiments. The resulting dielectric stack exhibits good leakage properties, and does not dramatically degrade carrier mobility in graphene field effect transistors (FETs). Further, by utilizing NFC-1400 and grapheme as discussed herein, top gated intrinsic mobilities of 7800 cm$^2$/Vs and device mobilities of 3900-4400 cm$^2$/Vs have been achieved.

Additionally, regarding the polymer NFC 1400 (by JSR Micro, Inc.), as discussed herein, this commercially available polymer is a derivative of polyhydroxystyrene that is conventionally used as a planarizing underlayer in lithographic processes. By way of example and not limitation, the polymer NFC 1400 can be diluted in propylene glycol monomethyl ether acetate (PGMEA), and spin-coated onto the graphene surface in accordance with exemplary embodiments. The dilution and spin speed are adjusted to control the desired thickness and uniformity of the buffer layer. Methyl and hydroxyl groups contained within the polymer structure serve as ideal reaction sites for atomic layer deposition (ALD) of HfO$_2$, the high-κ component of the dielectric stack. ALD of this material is accomplished using tetrakis(dimethylamido)-hafnium and water at a deposition temperature, e.g., of 125° C. This low temperature deposition process produces HfO$_2$ films with a dielectric constant of κ=13. In order to be an adequate gate dielectric, the NFC 1400/HfO$_2$ stack should coat the entire gated area of the graphene channel. Since pristine graphene is inert to ALD reactions, it is noted that the NFC layer should be continuous on the graphene surface. In accordance with exemplary embodiments, it is noted that a 24:1 dilution (by volume) of PGMEA:NFC is sufficient for accomplishing this. Spinning this solution at a rate of 4,000 rpm for 60 seconds results in a buffer layer that is approximately 10 nm thick.

Figure 14:
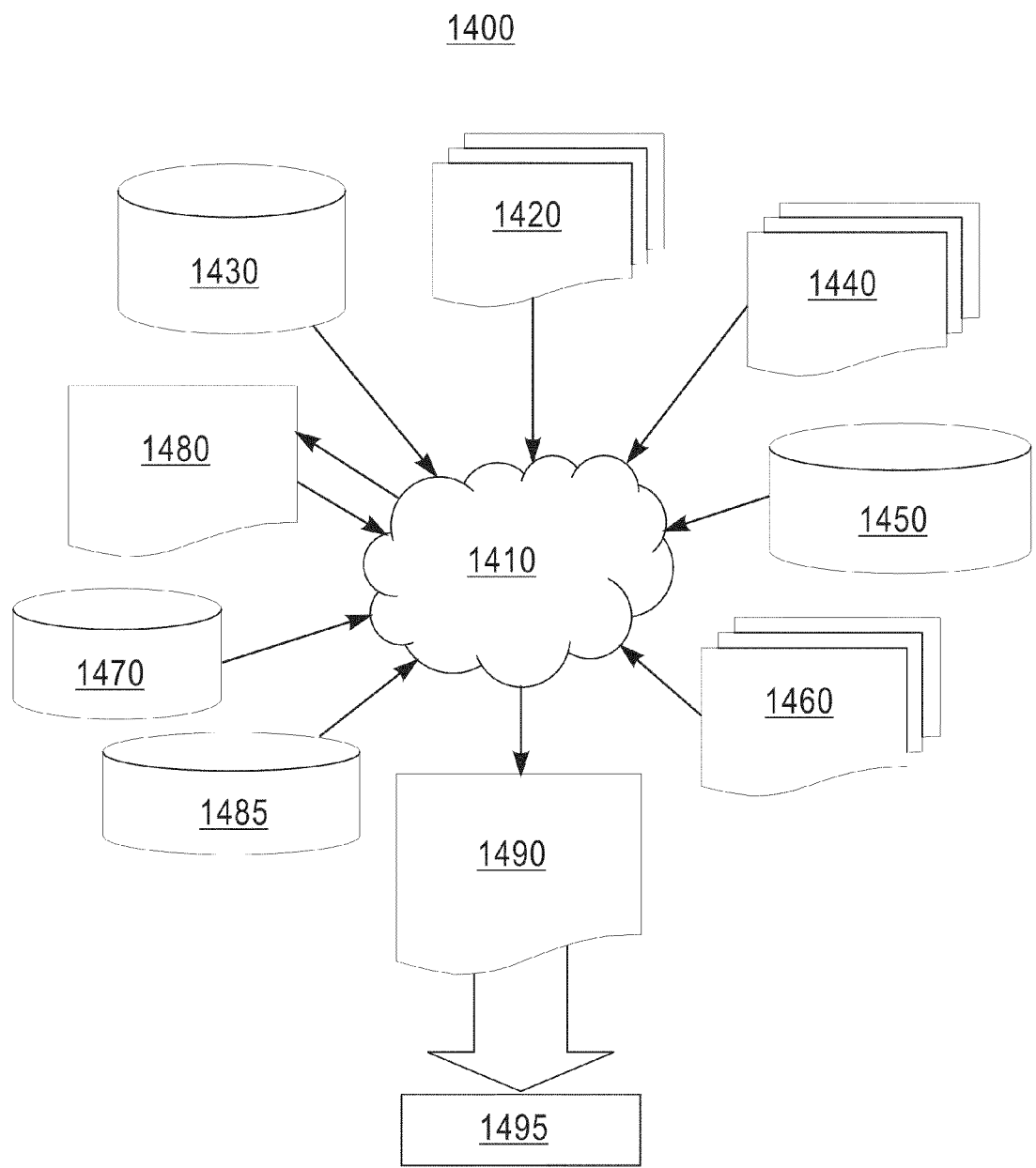
FIG. 14 illustrates a block diagram of an exemplary design flow used for example, in semiconductor IC logic design, simulation, test, layout, and manufacture in accordance with exemplary embodiments.

FIG. 14 shows a block diagram of an exemplary design flow 1400 used for example, in semiconductor IC logic design, simulation, test, layout, and manufacture. Design flow 1400 includes processes, machines and/or mechanisms for processing design structures or devices to generate logically or otherwise functionally equivalent representations of the design structures and/or devices described above and shown in FIGS. 1-9. The design structures processed and/or generated by design flow 1400 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1400 may vary depending on the type of representation being designed. For example, a design flow 1400 for building an application specific IC (ASIC) may differ from a design flow 1400 for designing a standard component or from a design flow 1400 for instantiating the design into a programmable array, for example a programmable gate array (PGA) or a field programmable gate array (FPGA) offered by Altera® Inc. or Xilinx® Inc.

FIG. 14 illustrates multiple such design structures including an input design structure 1420 that is preferably processed by a design process 1410. Design structure 1420 may be a logical simulation design structure generated and processed by design process 1410 to produce a logically equivalent functional representation of a hardware device. Design structure 1420 may also or alternatively comprise data and/or program instructions that when processed by design process 1410, generate a functional representation of the physical structure of a hardware device. Whether representing functional and/or structural design features, design structure 1420 may be generated using electronic computer-aided design (ECAD) such as implemented by a core developer/designer. When encoded on a machine-readable data transmission, gate array, or storage medium, design structure 1420 may be accessed and processed by one or more hardware and/or software modules within design process 1410 to simulate or otherwise functionally represent an electronic component, circuit, electronic or logic module, apparatus, device, or system such as those shown in FIGS. 1-9. As such, design structure 1420 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1410 preferably employs and incorporates hardware and/or software modules for synthesizing, translating, or otherwise processing a design/simulation functional equivalent of the components, circuits, devices, or logic structures shown in FIGS. 1-9 to generate a netlist 1480 which may contain design structures such as design structure 1420. Netlist 1480 may comprise, for example, compiled or otherwise processed data structures representing a list of wires, discrete components, logic gates, control circuits, I/O devices, models, etc. that describes the connections to other elements and circuits in an integrated circuit design. Netlist 1480 may be synthesized using an iterative process in which netlist 1480 is resynthesized one or more times depending on design specifications and parameters for the device. As with other design structure types described herein, netlist 1480 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1410 may include hardware and software modules for processing a variety of input data structure types including netlist 1480. Such data structure types may reside, for example, within library elements 1430 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1440, characterization data 1450, verification data 1460, design rules 1470, and test data files 1485 which may include input test patterns, output test results, and other testing information. Design process 1410 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1410 without deviating from the scope and spirit of the invention. Design process 1410 may also include modules for performing standard circuit design processes such as timing analysis, verification, design rule checking, place and route operations, etc. Design process 1410 employs and incorporates logic and physical design tools such as HDL compilers and simulation model build tools to process design structure 1420 together with some or all of the depicted supporting data structures along with any additional mechanical design or data (if applicable), to generate a second design structure 1490. Design structure 1490 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1420, design structure 1490 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-9. In one embodiment, design structure 1490 may comprise a compiled, executable HDL simulation model that functionally simulates the devices shown in FIGS. 1-9.

Design structure 1490 may also employ a data format used for the exchange of layout data of integrated circuits and/or symbolic data format (e.g. information stored in a GDSII (GDS2), GL1, OASIS, map files, or any other suitable format for storing such design data structures). Design structure 1490 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-9. Design structure 1490 may then proceed to a stage 1495 where, for example, design structure 1490: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inven- The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While exemplary embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A fabrication process for a nanoelectronic device, comprising:
    depositing graphene as the channel material on a substrate to form a channel, wherein the substrate is selected from silicon carbide, silicon dioxide, aluminum oxide, or a combination thereof;
    depositing a source metal contact and a drain metal contact on the channel material, wherein the source metal contact and the drain metal contact are on opposing ends of the channel material;
    patterning the graphene by:
        depositing an elongated mask connecting the source metal contact and the drain metal contact; and
        etching the graphene to form the channel in a narrowed elongated shape connecting the source metal contact and the drain metal contact;
    depositing a layer of polyhydroxystyrene derivative on top of and touching the channel material, on top of and touching the source metal contact, and on top of and touching the drain metal contact;
    causing the layer of polyhydroxystyrene derivative previously deposited to remain on top of and touching each of the channel material, the source metal contact, and the drain metal contact throughout completion of the nanoelectronic device;
    depositing a top gate oxide on the polyhydroxystyrene derivative; and
    depositing a top gate metal on the top gate oxide.

2. The process of claim 1, further comprising depositing the polyhydroxystyrene derivative on the source metal contact, the drain metal contact, and the substrate.

3. The process of claim 1, wherein the polyhydroxystyrene derivative is operative to:
    have a thickness that can be scaled through chemical dilution;
    uniformly coat the surface of the graphene;
    not damage the graphene surface;
    not chemically react with the graphene surface; and
    not dramatically degrade carrier mobility in the graphene.

4. The process of claim 1, wherein processing of the polyhydroxystyrene derivative is implemented at low temperatures; and
    wherein the polyhydroxystyrene derivative chemically reacts with atomic layer deposition (ALD) and chemical vapor deposition (CVD) precursors.

5. A fabrication process for a nanoelectronic device, comprising:
    depositing a first polymer layer on a substrate;
    depositing graphene as channel material on the first polymer layer to form a channel;
    depositing a source metal contact and a drain metal contact on the channel material, wherein the source metal contact and the drain metal contact are on opposing ends of the channel material;
    patterning the graphene by:
        depositing an elongated mask connecting the source metal contact and the drain metal contact; and
        etching the graphene to form the channel in a narrowed elongated shape connecting the source metal contact and the drain metal contact;
    depositing a second polymer layer on top of and touching the channel material, on top of and touching the source metal contact, and on top of and touching the drain metal contact, wherein the first polymer layer and the second polymer layer sandwich the channel material;
    causing the second polymer layer previously deposited to remain on top of and touching each of the channel material, the source metal contact, and the drain metal contact throughout completion of the nano electronic device;
    depositing a top gate oxide on the second polymer layer, wherein the first polymer layer and the second polymer layer are a polyhydroxystyrene derivative; and
    depositing a top gate metal on the top gate oxide.

6. The process of claim 5, further comprising depositing the second polymer layer on the source metal contact, the drain metal contact, and the substrate.

7. The process of claim 5, wherein the first and second polymer layers are operative to:
    have a thickness that can be scaled through chemical dilution;
    uniformly coat the surface of the graphene;
    not damage the graphene surface;
    not chemically react with the graphene surface; and
    not dramatically degrade carrier mobility in the graphene.

8. The process of claim 5, wherein processing of the first and second polymer layers are implemented at low temperatures; and
    wherein the polymer layer chemically reacts with atomic layer deposition (ALD) and chemical vapor deposition (CVD) precursors.

* * * * *